United States Patent
Iwasaki

(10) Patent No.: US 7,843,073 B2
(45) Date of Patent: Nov. 30, 2010

(54) SEMICONDUCTOR DEVICE AND METHOD FOR FABRICATING THE SAME

(75) Inventor: Akihisa Iwasaki, Shiga (JP)

(73) Assignee: Panasonic Corporation, Osaka (JP)

( * ) Notice: Subject to any disclaimer, the term of this patent is extended or adjusted under 35 U.S.C. 154(b) by 124 days.

(21) Appl. No.: 12/208,633

(22) Filed: Sep. 11, 2008

(65) Prior Publication Data

US 2009/0096109 A1 Apr. 16, 2009

(30) Foreign Application Priority Data

Oct. 11, 2007 (JP) .............................. 2007-265248

(51) Int. Cl.
*H01L 23/48* (2006.01)
*H01L 21/764* (2006.01)
*H01L 21/768* (2006.01)

(52) U.S. Cl. .............................. 257/774; 257/E21.573; 257/E21.581

(58) Field of Classification Search ................. 257/774, 257/E21.573, E21.581

See application file for complete search history.

(56) References Cited

U.S. PATENT DOCUMENTS

| 5,869,880 | A | * | 2/1999 | Grill et al. .................. 257/522 |
| 6,297,150 | B1 | | 10/2001 | Morinaga |
| 6,307,265 | B1 | | 10/2001 | Anand et al. |
| 7,268,432 | B2 | * | 9/2007 | Colburn et al. .............. 257/774 |
| 7,348,280 | B2 | * | 3/2008 | Hsu et al. .................... 438/778 |
| 7,396,757 | B2 | * | 7/2008 | Yang .......................... 438/619 |
| 7,534,696 | B2 | * | 5/2009 | Jahnes et al. ................. 438/421 |
| 2001/0003379 | A1 | | 6/2001 | Seo |
| 2005/0079719 | A1 | | 4/2005 | Colburn et al. |
| 2005/0272341 | A1 | | 12/2005 | Colburn et al. |

FOREIGN PATENT DOCUMENTS

| JP | 09-237831 | 9/1997 |
| JP | 2003-115534 | 4/2003 |
| JP | 2005-268783 | 9/2005 |

* cited by examiner

*Primary Examiner*—Luan C Thai
(74) *Attorney, Agent, or Firm*—McDermott Will & Emery LLP

(57) ABSTRACT

A semiconductor device includes: a first insulation film formed over a semiconductor substrate; and a plurality of first interconnects selectively formed in the first insulation film. A plurality of gaps are formed in part of the first insulation film located between adjacent ones of the first interconnects so that each of the gaps has a cylindrical shape extending vertically to a principal surface of the semiconductor substrate. A cap film is formed of metal or a material containing metal in upper part of each of the first interconnects.

13 Claims, 6 Drawing Sheets

SEMICONDUCTOR DEVICE AND METHOD FOR FABRICATING THE SAME

CROSS-REFERENCE TO RELATED APPLICATION

The disclosure of Japanese Patent Application No. 2007-265248 filed on Oct. 11, 2007, including specification, drawings and claims is incorporated herein by reference in its entirety.

BACKGROUND OF THE INVENTION

The present invention relates to a semiconductor device and a method for fabricating the semiconductor device, and more particularly relates to a semiconductor device having an interconnect structure including air gaps and a method for fabricating the semiconductor device.

In recent years, in order to increase the operation speed of semiconductor devices, application of an air gap interconnect structure to semiconductor device fabrication processes has been examined. Normally, for RC delays (i.e., delays generated from resistive components and capacitive components) of an interconnect, a delay generated from capacitive components is determined by a relative permittivity of an insulation film located around the interconnect. One reason why application of an air gap interconnect is put under examination now is that as the size of semiconductor devices has been reduced more and more, causes for delay due to a relative permittivity of an insulation film come to have as large influences as or even larger influences than influences of the operation speed of a transistor.

To cope with this, further reduction in relative permittivity of an insulation film has been examined as a possible solution. The relative permittivity of silicon oxide, which is mainly used as an interlevel insulation film, is 4.1. A low permittivity film (i.e., a porous low-k film) having a relative permittivity of about 2.0 has been recently developed. However, there is a limit to reduction in relative permittivity of a low permittivity film. In the air gap interconnect structure, gaps are formed around interconnects and thus the relative permittivity can be reduced to 1. Accordingly, the operation speed of the semiconductor device can be further increased. Therefore, practical application of air gap interconnects particularly in a 32 nm-interconnect width generation and beyond is expected.

As a method for forming air gaps according to a first known example, the following method is described in Japanese Laid-Open Publication No. 09-237831. First, a carbon layer is formed on an insulation film. Subsequently, interconnect grooves are formed in the carbon layer and then a metal film is buried in the interconnect grooves, thereby forming interconnects. Next, a silicon oxide film is deposited over an entire surface of the carbon layer as well as the interconnects. Subsequently, the carbon layer is ashed by heat treatment, thereby forming gaps between the interconnects. Then, formation of an interconnect layer is repeated, thereby forming multilayer interconnects. The above-described formation method is also described in Japanese Laid-Open Publication No. 2003-115534.

However, the method for forming an air gap interconnect structure according to the first known example has a problem that a silicon oxide film is supported by only interconnects and thus a mechanical strength of a semiconductor device is reduced. There also another problem arises that when misalignment between lower layer interconnects and contact holes for connecting the lower layer interconnects to upper layer interconnects caused in forming multilayer interconnects becomes out of an allowable range, the contact holes pass through to air gaps formed between the lower layer interconnects. As a solution to the above-described problems, an interconnect structure including nano-column air gaps has been proposed. In this structure, since nano-scale, column (pillar) shape air gaps are formed between interconnects, a high occupancy of insulation films between interconnects can be achieved, thus resulting in ensured mechanical strength. Moreover, even when misalignment between contact holes and lower layer interconnects is caused, the width of each of air gaps formed between lower layer interconnects is nano-scale and therefore the misalignment does not cause any problem.

Hereafter, a method for fabricating a semiconductor device using nano-column air gaps according to a second known example will be described with reference to FIGS. 6A and 6B.

FIGS. 6A and 6B are cross-sectional views illustrating respective steps for fabricating a copper interconnect having nano-column air gaps according to the second known example in order.

First, as shown in FIG. 6A, an interlevel insulation film 111 is formed on a semiconductor substrate (not shown) in which function devices and the like are formed. Subsequently, lithography is performed to form lower layer interconnect grooves 111a in the interlevel insulation film 111. Then, a barrier metal film 112a of a stacked layer film of tantalum (Ta) and tantalum nitride (TaN) and lower layer interconnects 112 of a copper film 112b are formed in the lower layer interconnect grooves 111a.

Next, as shown in FIG. 6B, a hole resist pattern 113 including openings each having a diameter of several ten nanometers is formed on the interlevel insulation film 111 including the lower layer interconnects 112 by lithography.

Next, using the hole resist pattern 113 as a mask, dry etching is performed to the interlevel insulation film 111, thereby forming a plurality of nano column holes in the interlevel insulation film 111.

However, the fabrication method according to the second known example has three problems as described below. First, as in FIG. 6B, it is difficult to form a pattern with a size of 50 nm or smaller using the present lithography technique. Therefore, in forming nano holes each having a diameter of 50 nm or smaller, some other method has to be used.

Second, the hole resist pattern 113 is formed on the lower layer interconnects (metal) 112 and the interlevel insulation film 111, which are made of different materials, for example, having different reflectivities, respectively. Accordingly, a light exposure amount in lithography on metal differs from that on an insulation film. As a result, it becomes difficult to form a uniform hole resist pattern 113 and shapes of resultant nano holes are non-uniform.

Third, in forming nano holes in the interlevel insulation film 111, the lower layer interconnects 112 are also subjected to a severe reactive ion etching process by dry etching. Therefore, it becomes difficult to form highly reliable interconnects.

To solve above-described problems, as a third known example, the following structure is adopted in Japanese Laid-Open Publication No. 2005-268783. FIG. 7 is a cross-sectional view illustrating a semiconductor device to which a structure including nano-column air gaps described in Japanese Laid-Open Publication No. 2005-268783 is applied. First, to solve the second problem, lower layer interconnect grooves 121a are formed in an interlevel insulation film 121 formed on a semiconductor substrate 120. Thereafter, another insulation film is evenly formed on the interlevel insulation film in which the lower layer interconnect grooves 121a are formed. As a result, a uniform hole pattern can be formed.

Moreover, to solve the third problem, as shown in FIG. 7, for example, holes 121b and another insulation film are formed so that the holes 121b are located in part between the lower layer interconnect grooves 121a. Subsequently, after said another insulation film is removed, oxide film sidewalls 123 are formed to serve as a protective film for protecting the lower layer interconnect grooves 121a and the interlevel insulation film 121. Lastly, a barrier film 122a and a metal film 122b are buried in the lower layer interconnect grooves 121a, thereby forming lower layer interconnects 122. As a result, the lower layer interconnects 122 are no longer subjected to an ion etching process.

However, use of the method for fabricating a semiconductor device according to the third known example can not solve the first problem that formation of a resist pattern having a size of 50 nm or smaller using the current lithography technique is difficult, and also causes another problem. Specifically, there arises a problem that because the oxide film sidewalls 123 are formed on each of side walls of the interlevel insulation film 121, the lower layer interconnect 122 and the like, an effective permittivity between the lower layer interconnects 122 is increased and variation in interconnect width are increased.

SUMMARY OF THE INVENTION

The present invention has been devised to solve the above-described problems. It is therefore an object of the present invention to solve problems caused by a reflectivity difference generated in forming a nano hole pattern and also a problem of reduction in reliability of interconnects due to etching, while suppressing increase in effective permittivity between interconnects in the same interconnect layer and also in variation of interconnect width.

To achieve the above-described object, the present invention provides a semiconductor device and a method for fabricating a semiconductor device in which a cap film is formed of a metal or a material containing metal on an interlevel insulation film including nano holes so as to cover an interconnect.

Specifically, a semiconductor device according to the present invention is characterized in that the semiconductor device includes: a first insulation film formed over a semiconductor substrate; and a plurality of first interconnects selectively formed in the first insulation film, a plurality of gaps are formed in part of the first insulation film located between adjacent ones of the first interconnects so that each of the gaps has a cylindrical shape extending vertically to a principal surface of the semiconductor substrate, and a cap film is formed of metal or a material containing metal in upper part of each of the first interconnects.

In the semiconductor device of the present invention, the cap film formed of metal or a material containing metal is provided in upper part of each of the first interconnects. Thus, when a plurality of gaps are formed in the insulation film in which first interconnects are to be formed so that each of the gaps has a cylindrical shape extending vertically to a substrate surface, etching damages are not given on the first interconnects. Therefore, the reliability of the interconnects is not reduced.

In the semiconductor device of the present invention, it is preferable that the plurality of gaps are formed as an array pattern in the first insulation film.

In the semiconductor device of the present invention, it is preferable that a bottom of each of the gaps has a diameter of 2 nm or more and 50 nm or less.

It is preferable that the semiconductor device of the present invention further includes a second insulation film formed under the first insulation film so as to be in contact with respective bottoms of the gaps.

It is preferable that when the semiconductor device of the present invention further includes a second insulation film in contact with the first interconnects, the gaps pass through the first insulation film.

Also, it is preferable that the first insulation film has a smaller permittivity than a permittivity of the second insulation film.

It is preferable that the semiconductor device of the present invention further includes: a third insulation film formed on the first insulation film so as to be in contact with the first interconnects; and second interconnects formed in the third insulation film.

In the semiconductor device of the present invention, it is preferable that the cap film is formed of metal of Co, Mn, W, Ta or Ru, an alloy containing at least one metal selected from the group consisting of Co, Mn, W, Ta and Ru, metal oxide of Co, Mn, W, Ta or Ru, or CuSiN, and the cap film is conductive.

A method for fabricating a semiconductor device according to the present invention is characterized by including the steps of: a) forming a first insulation film over a semiconductor substrate; b) selectively forming, after the step a), a plurality of first interconnects in the first insulation film; c) forming, after the step b), a cap film of metal or a material containing metal in upper part of each of the first interconnects; and d) forming, after the step c), a plurality of gaps in part of the first insulation film located between adjacent ones of the first interconnects so that each of the gaps has a cylindrical shape extending vertically to a principal surface of the semiconductor substrate.

According to the semiconductor device fabrication method of the present invention, etching damages are not given on the first interconnects covered by the cap film. Thus, the reliability of the interconnects is not reduced.

In the semiconductor device fabrication method of the present invention, it is preferable that in the step d), the plurality of gaps are formed as an array pattern in the first insulation film.

In the semiconductor device fabrication method of the present invention, it is preferable that a bottom of each of the gaps has a diameter of 2 nm or more and 50 nm or less.

It is preferable that the semiconductor device fabrication method of the present invention further includes, before the step a), the step e) of forming a second insulation film between the semiconductor substrate and the first insulation film so that the second insulation film is in contact with respective bottoms of the gaps.

In the semiconductor device fabrication method of the present invention, it is preferable that in the step e), the second insulation film is formed so that an interface of the first insulation film and the second insulation film is located lower than lower part of each of the first interconnects.

In the semiconductor device fabrication method of the present invention, it is preferable that in the step d), the gaps are formed so that the gaps pass through the first insulation film.

In the semiconductor device fabrication method of the present invention, it is preferable that the first insulation film has a smaller permittivity than a permittivity of the second insulation film.

It is preferable that the semiconductor device fabrication method of the present invention further includes the steps of: f) forming, after the step d), a third insulation film on the first insulation film so that the third insulation film is in contact with the first interconnects; and g) forming, after the step f), second interconnects formed in the third insulation film.

In the semiconductor device fabrication method of the present invention, it is preferable that in the step d), the gaps are formed by gas cluster ion beam processing.

In this case, is it preferable that in the gas cluster ion beam processing, at least one selected from the group consisting of Ar, C, $SiH_4$, $NH_3$, $CH_4$ and $CF_4$ is used to form gas cluster ions.

In the semiconductor device fabrication method of the present invention, it is preferable that in the step c), the cap film is formed of at least one selected from the group consisting of CoWP, CoWB, NiMoP and NiMoB by selective plating.

In the semiconductor device fabrication method of the present invention, it is preferable that in the step c), the cap film is formed of at least one selected from the group consisting of Ta, Ru, Co, Mn, W, $SiH_4$ and $NH_3$ by gas cluster ion beam processing.

As has been described, in a semiconductor device according to the present invention, a cap film formed of metal or a material containing metal is provided on each interconnect. Thus, increase in the effective permittivity between adjacent interconnects and also increase in variation in interconnect width can be prevented.

Moreover, in a method for fabricating a semiconductor device according to the present invention, gas cluster ion beam processing is used for forming nano holes (gaps). Thus, nano holes can be reliably formed and deficiencies in pattern formation caused by differences in light reflectivity and reduction in reliability of interconnects due to etching can be prevented.

DESCRIPTION OF THE PREFERRED EMBODIMENTS

First Embodiment

A first embodiment of the present invention will be described with reference to the accompanying drawings.

Figure 1:
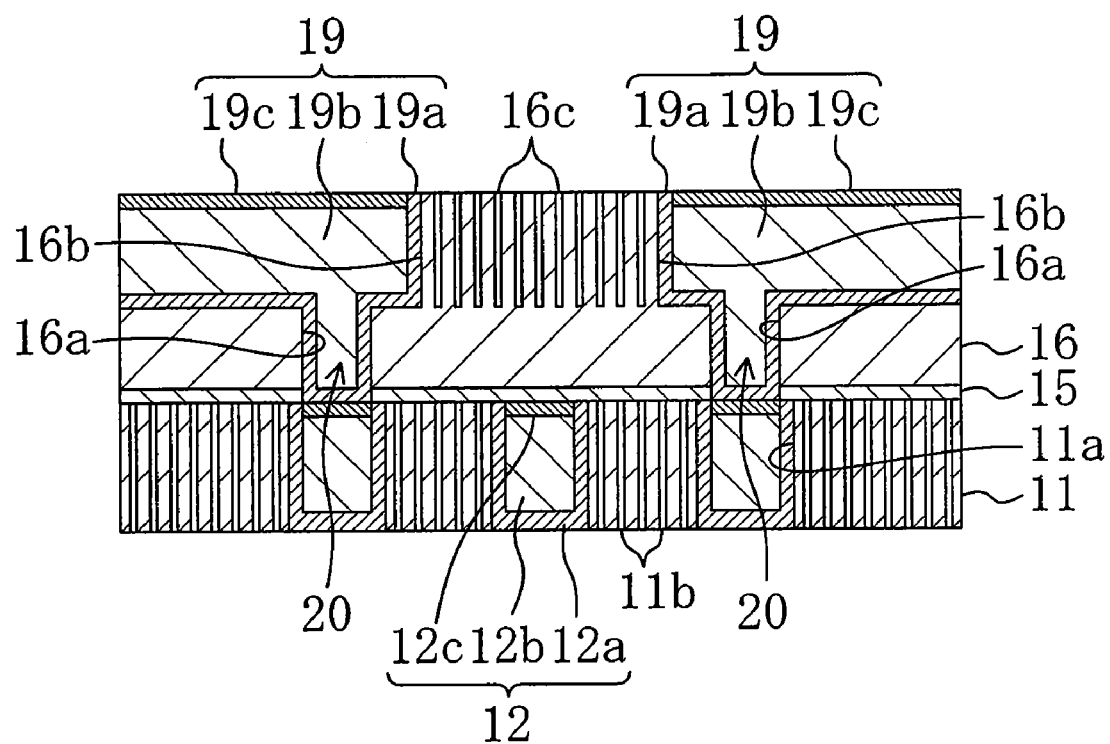
FIG. 1 is a cross-sectional view illustrating major part of a semiconductor device according to a first embodiment of the present invention.

FIG. 1 is a cross-sectional view illustrating major part (interconnect part) of a semiconductor device according to a first embodiment of the present invention. As shown in FIG. 1, a plurality of lower layer interconnects 12 are selectively formed in a first interlevel insulation film 11.

Each of the lower layer interconnects 12 is formed of a first barrier metal film 12a of a stacked layer film of tantalum (Ta) and tantalum nitride (TaN) on bottom and wall surfaces of a lower layer interconnect groove 11a formed in the first interlevel insulation film 11, a first copper film 12b provided on the first barrier metal film 12a to fill the lower layer interconnect groove 11a and a first cap film 12c formed of metal or a material containing metal in upper part of the first copper film 12b.

An insulation material having a small mechanical strength (relative permittivity), such as, for example, carbon-containing silicon oxide (SiOC) having a relative permittivity k of about 1.8 to 2.2, is used for the first interlevel insulation film 11. In the first interlevel insulation film 11, a plurality of cylindrical gaps (first nano column holes 11b), each having a diameter of a nanometer dimension, for example, about 2 nm to 5 nm, are formed. Note that as an insulation material having a small mechanical strength, besides SiOC, Aurora, SiLK, SLK, NCS, HSQ, MSQ, polyimide or the like can be used.

An insulation barrier film 15 is formed of silicon carbide (SiC) on the first interlevel insulation film 11 as well as each of the lower layer interconnects 12. As a material of the insulation barrier film 15, besides SiC, SiN, SiCO, SiCN, benzocyclobutene (BCB) or the like can be used.

A second interlevel insulation film 16 is formed of the same material as that of the first interlevel insulation film 11 on the insulation barrier film 15. On the second interlevel insulation film 16, a plurality of upper layer interconnects 19 are selectively formed.

In part of the second interlevel insulation film 16 located between the upper layer interconnects 19, second nano column holes 16c which are similar to the nano column hole 11b are formed.

As the lower layer interconnects 12, each of the upper layer interconnects 19 is formed of a second barrier metal film 19a of a stacked layer film of Ta and TaN on bottom and wall surface of a lower layer interconnect groove 16b, a second copper film 19b provided on the second barrier metal film 19a to fill the groove, and a second cap film 19c formed of metal or a material containing metal in upper part of the second copper film 19b.

Herein, for the first cap film 12c and the second cap film 19c, for example, silicon nitride containing copper (CuSiN) film is used.

In the second interlevel insulation film 16, plugs 20 each being formed of parts of the second barrier metal film 19a and the second copper film 19b in a contact hole 16a. Thus, the lower layer interconnects 12 are electrically connected to the upper layer interconnects 19 via the plugs 20, respectively. Each of the first barrier metal film 12a and the second barrier metal film 19a functions as a copper diffusion prevention film.

As has been described, in the semiconductor device of the first embodiment, the cap films 12c and 19c each being formed of metal or a material containing metal are provided in upper parts of each lower layer interconnect 12 and each upper layer interconnect 19, respectively. Due to the existence of the first cap film 12c and the second cap film 19c, each of the first copper film 12b and the second copper film 19b has an improved resistance against etching damages, so that reduction in reliability of interconnects can be prevented.

Moreover, unlike the third known example, sidewalls formed of an insulation film are not provided on the first interlevel insulation film 11 and the gaps 11b. Thus, as compared to the structure in which the sidewalls are provided, the effective permittivity between adjacent interconnects is reduced and variation in interconnect width is not generated.

Hereafter, a method for fabricating a semiconductor device having the above-described structure will be described with reference to the accompanying drawings.

FIGS. 2A through 2E and FIGS. 3A through 3D are cross-sectional views illustrating respective steps for fabricating a semiconductor device of the first embodiment of the present invention in order.

Figure 2A:
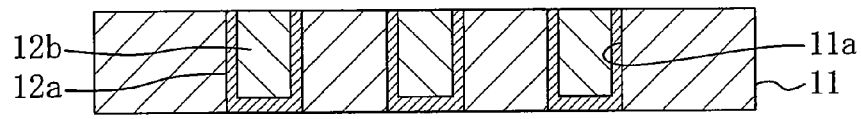
FIGS. 2A through 2E are cross-sectional views illustrating respective steps for fabricating the semiconductor device according to the first embodiment of the present invention in order.

First, as shown in FIG. 2A, a first interlevel insulation film 11 having a small mechanical strength (permittivity), such as, for example, a carbon-containing silicon oxide (SiOC) film having a relative permittivity k of about 1.8 to 2.2, is formed on a semiconductor substrate (not shown) of silicon (Si) in which function elements and the like are formed. Subsequently, a first sacrificial film (not shown) of silicon oxide is formed on the first interlevel insulation film 11. Note that the first sacrificial film is removed in a CMP (chemical mechanical polishing) step performed to lower layer interconnects, which will be described later. Thereafter, a resist pattern (not shown) having a lower layer interconnect groove formation pattern is formed on the first sacrificial film by lithography and then dry etching is performed to the first sacrificial film and the first interlevel insulation film 11 using the resist pattern as a mask, thereby forming lower layer interconnect grooves 11a. Subsequently, a first barrier metal film 12a of a Ta/TaN stacked layer film and a copper seed film (not shown) are deposited in this order by sputtering on bottom and side surfaces of each of the lower layer interconnect grooves 11a formed in the first sacrificial film and the first interlevel insulation film 11. Subsequently, a first copper film 12b is deposited over the copper seed film by electrolytic plating to fill each of the lower layer interconnect grooves 11a. Subsequently, parts of the first barrier metal film 12a and the first copper film 12b (including the copper seed film and this also applies to the following description) located outside the lower layer interconnect grooves 11a are removed by CMP, thereby patterning to the first barrier metal film 12a and the first copper film 12b.

Figure 2B:
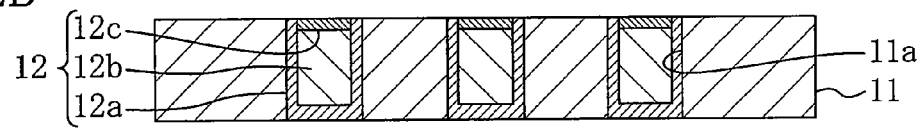

Next, as shown in FIG. 2B, a first cap film 12c is formed of CuSiN in upper part of the first copper film 12b, for example, by gas cluster ion beam processing. Thus, lower layer interconnects 12 each being formed of the first barrier metal film 12a, the first copper film 12b and the first cap film 12c are obtained. Herein, mixed gas of $SiH_4$ and $NH_3$ is irradiated as gas cluster ion beam to form the first cap film 12c from the first copper film 12b. In the first embodiment, $SiH_4$ and $NH_3$ are used as gas cluster ion beam seeds. However, gas cluster ion beam seeds are not limited to $SiH_4$ and $NH_3$ but at least one material selected from the group consisting of tantalum (Ta), ruthenium (Ru), cobalt (Co), manganese (Mn), tungsten (W), silane ($SiH_4$) and ammonia ($NH_3$) may be used as a gas cluster ion beam seed. Moreover, to form the first cap film 12c, gas cluster ion beam processing is used. The method for forming the first cap film 12c is not limited to this method but, for example, selective plating using at least one material selected from the group consisting of cobalt tungsten phosphide (CoWP), cobalt tungsten boride (CoWB), nickel molybdenum phosphide (NiMoP) and nickel molybdenum boride (NiMoB) may be used.

Figure 2C:
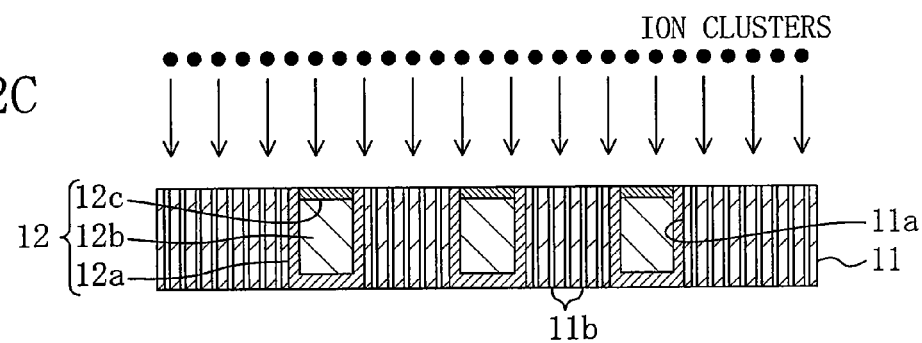

Next, as shown in FIG. 2C, for example, by gas cluster ion beam processing using argon ($Ar^+$) ions, gas cluster ion beam is irradiated to an entire upper surface of the first interlevel insulation film 11 as well as the lower layer interconnects 12 to form a plurality of first nano column holes 11b having a diameter of nanometer dimension and arranged in a predetermined array pattern. In this process, it is preferable that $Ar^+$ ions are formed into clusters each including about several hundreds mol of molecules and having a diameter of several nm and the clusters are irradiated at an acceleration energy of about 50 keV to several hundreds keV. In the first embodiment, argon (Ar) is used as a material for forming gas clusters. However, at least one material selected from the group consisting of argon (Ar), carbon (C), silane ($SiH_4$), ammonia ($NH_3$), methane ($CH_4$) and carbon tetrafluoride ($CF_4$) may be used. The first interlevel insulation film 11 is a film having a small mechanical strength (permittivity) such as a carbon containing silicon oxide film having a relative permittivity k of about 1.8 to 2.2 and physical etching can be performed in a simple manner. Thus, the gaps (first nano column holes 11b) can be formed in the first interlevel insulation film 11 in a simple manner. Thereafter, UV (ultraviolet ray) cure is performed to the first interlevel insulation film 11 in which the nano column holes 11b are formed at a temperature of 200° C. to 400° C. Thus, the first interlevel insulation film 11 is made to be a high mechanical strength film having a relative permittivity of about 2.2 to 2.6.

Gas cluster ion beam processing will be described further in detail below. Gas cluster ion beam is mainly charged beam of clusters, each consisting of several hundreds to several tens of thousands of molecules and charged to monovalent. The charged beam is implanted to a sample such as an insulation film or the like to physically etch the sample, thereby forming a plurality of nano column air gaps. In this method, when the number of molecules is set to be small, the energy of a cluster is increased. Thus, holes having a diameter of several nm can be formed in a simple manner.

Figure 2D:
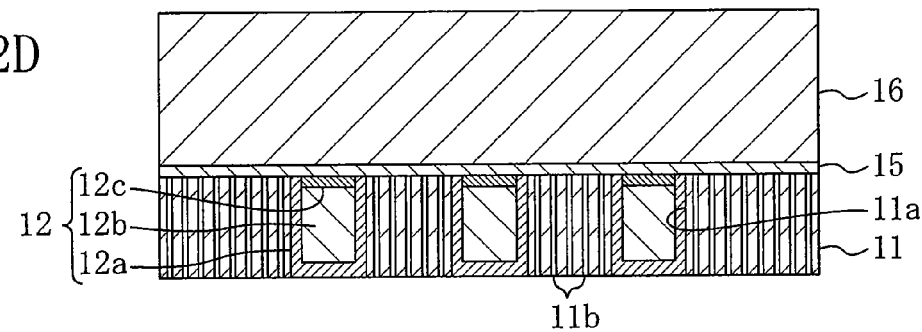

Next, as shown in FIG. 2D, an insulation barrier film 15 of, for example, silicon carbide for functioning a copper diffusion prevention film is deposited over the first interlevel insulation film 11 as well as the lower layer interconnects 12 to a thickness of about 5 nm. Subsequently, a second interlevel insulation film 16 having a small mechanical strength (permittivity) such a carbon containing silicon oxide film having a relative permittivity k of about 1.8 to 2.2 is deposited over the insulation barrier film 15 to a thickness of about 300 nm. Thereafter, a second sacrificial film (not shown) is formed of silicon oxide. Note that the second sacrificial film is removed by a CMP step to be performed to upper layer interconnects which will be described later.

Figure 2E:
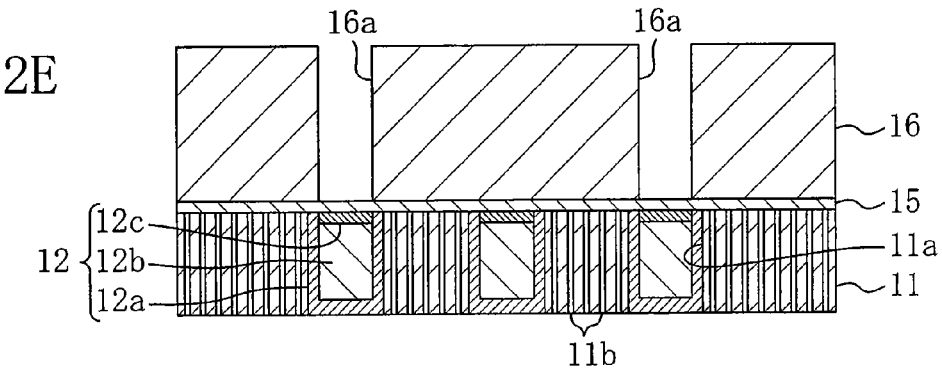

Next, as shown in FIG. 2E, a resist pattern (not shown) having a contact hole formation pattern is formed on the second sacrificial film by lithography and then dry etching is performed to the second sacrificial film and the second interlevel insulation film 16 using the resist pattern as a mask, thereby forming a plurality of contact holes 16a which pass through the second sacrificial film and the second interlevel insulation film 16 and through which the insulation barrier film 15 is exposed.

Figure 3A:
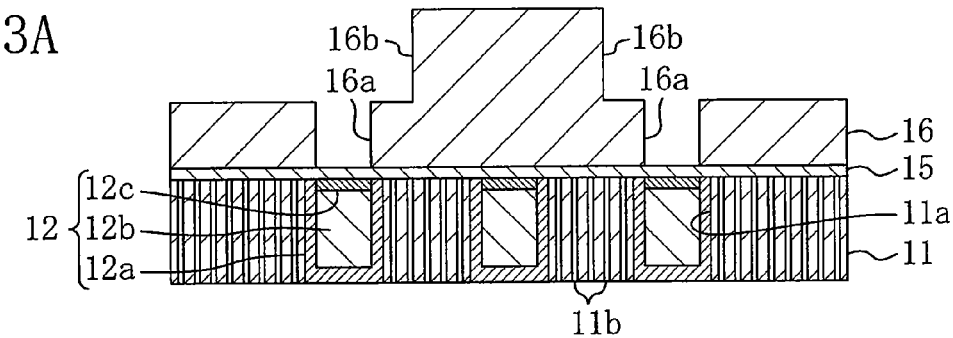
FIGS. 3A through 3D are cross-sectional views illustrating respective steps for fabricating the semiconductor device according to the first embodiment of the present invention in order.

Next, as shown in FIG. 3A, as in the same manner for forming the contact holes 16a, lithography and dry etching are performed to form openings in the second sacrificial film and the second interlevel insulation film 16, thereby forming upper layer interconnect grooves 16b which communicate the contact holes 16a, respectively, in upper parts of the second interlevel insulation film 16.

Figure 3B:
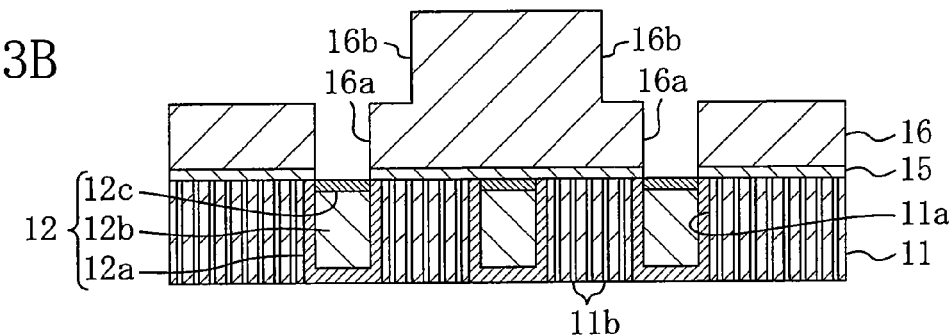

Next, as shown in FIG. 3B, the entire surface of the substrate is etched back by anisotropic dry etching, for example, using mixed gas of carbon tetrafluoride ($CF_4$) and nitride ($N_2$) to remove parts of the insulation barrier film 15 exposed through the contact holes 16a, thereby achieving exposure of the first cap film 12c.

Figure 3C:
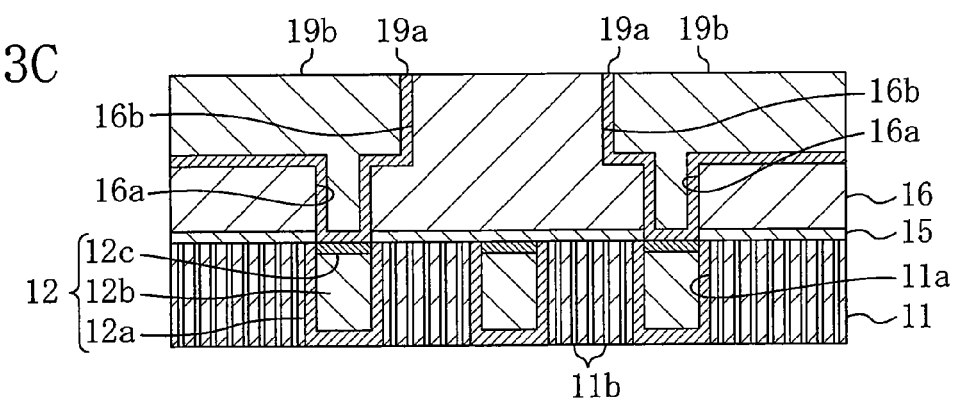

Next, as shown in FIG. 3C, a second barrier metal film 19a of a Ta/TaN stacked layer film and a copper seed film (not shown) are deposited in this order by sputtering on bottom and side surfaces of each of the contact holes 16a and the upper layer interconnects grooves 16b in the second interlevel insulation film 16. Subsequently, a second copper film 19b is deposited over the copper seed film by electrolytic plating so as to fill the contact holes 16a and the upper layer interconnect grooves 16b. Subsequently, parts of the second barrier metal film 19a and the second copper film 19b (including the copper seed film and this also applies to the following description) deposited outside of the upper layer interconnect grooves 16b and the second sacrificial film are removed by CMP, thereby patterning the second barrier metal film 19a and the second copper film 19b.

Figure 3D:
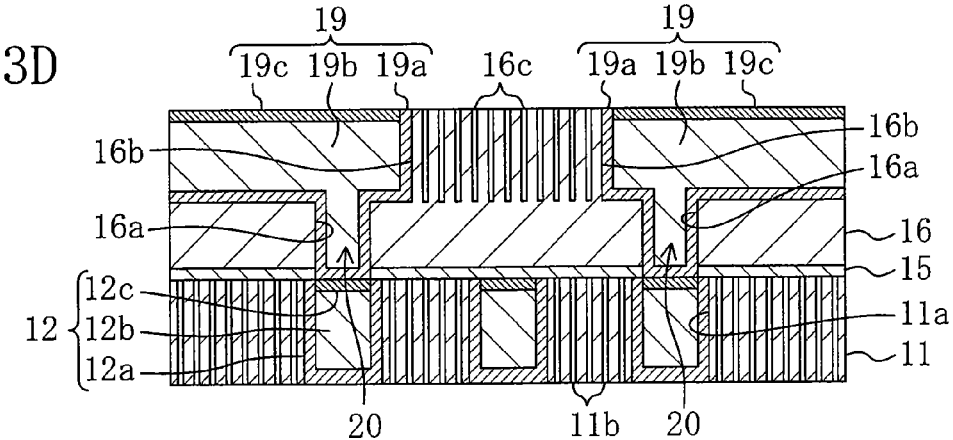

Next, as shown in FIG. 3D, gas cluster ion beam processing is performed in the same manner as shown in FIG. 2B to form a second cap film 19c of CuSiN in upper part of the second copper film 19b. Thus, an upper layer interconnects 19 each being formed of the second barrier metal film 19a, the second copper film 19b and the second cap film 19c is obtained. Subsequently, as in the same manner as shown in FIG. 2B, for example, by gas cluster ion beam processing, gas cluster ion beam is irradiated to an entire upper surface of the second interlevel insulation film 16 as well as the upper layer interconnects 19 to form a plurality of second nano column holes 16c in the second interlevel insulation film 16. Thereafter, UV cure is performed to the second interlevel insulation film 16 in which the second nano column holes 16c are formed at a temperature of about 200° C. to 400° C. Thus, the second interlevel insulation film 16 is made to be a high mechanical strength film having a relative permittivity k of about 2.2 to 2.6.

By repeating the above-described fabrication process steps, i.e., the process steps shown in FIGS. 2A through 2E and FIGS. 3A through 3D, a semiconductor device including multilayer copper interconnects can be obtained.

The method for fabricating a semiconductor device according to the first embodiment of the present invention is characterized in that, for example, the first cap film 12c containing metal as a main component is formed in upper part of the lower layer interconnects 12 and then the nano column holes 11b are formed in the first interlevel insulation film 11. Specifically, the first cap film 12c and the second cap film 19c are formed in upper parts of the first copper film 12b and the second copper film 19b, respectively, so that copper interconnects can have an improved resistance against etching damages and reduction in reliability of copper interconnects can be prevented Moreover, because metal having a relatively close lattice constant to that of copper is used, the first cap film 12c and the second cap film 19c used in the first embodiment also have the effect of improving resistance against electromigration of copper.

Moreover, in the first embodiment, each of the first cap film 12c and the second cap film 19c is selectively deposited using gas cluster ion beam processing, and then the nano column holes 11b and 16c are formed without forming a resist pattern by lithography. Thus, problems in pattern formation caused by a difference between a relativity of exposure light to interconnect metal and a relativity of exposure light to an interlevel insulation film can be advantageously solved.

Second Embodiment

Hereafter, a second embodiment of the present invention will be described with reference to the accompanying drawings.

Figure 4:
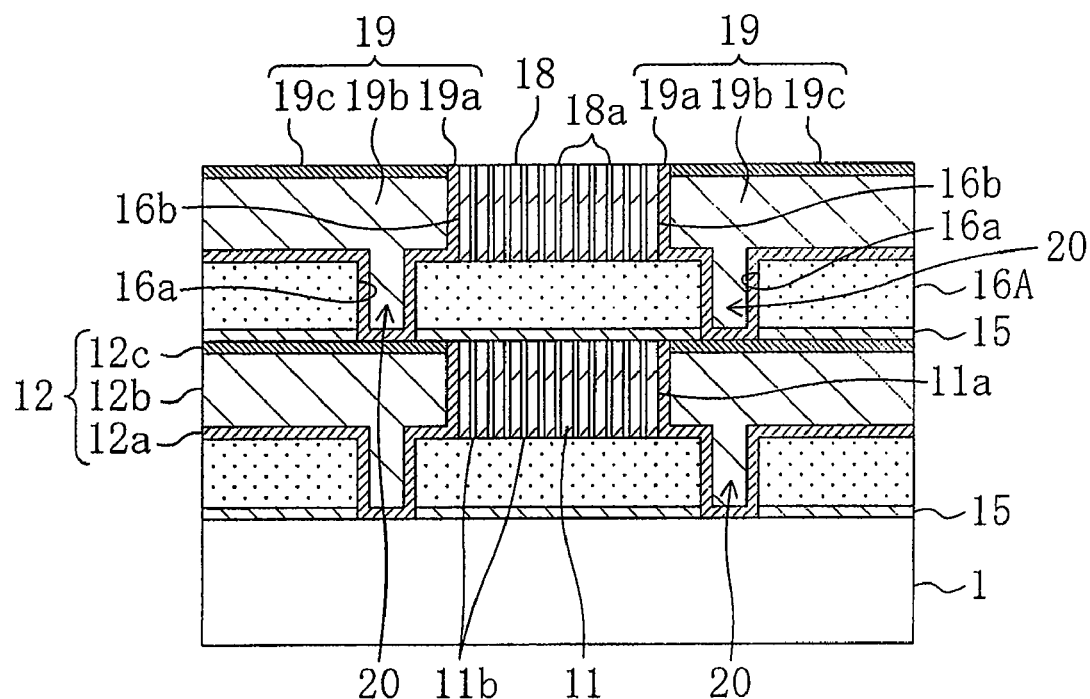
FIG. 4 is a cross-sectional view illustrating major part of a semiconductor device according to a second embodiment of the present invention.

FIG. 4 is a cross-sectional view illustrating a cross section of major part of a semiconductor device according to the second embodiment of the present invention. In FIG. 4, each member also shown in FIG. 1 is identified by the same reference numeral and therefore the description thereof will be omitted.

As shown in FIG. 4, a semiconductor device formed on a semiconductor substrate 1 according to the second embodiment is characterized in that an interlevel insulation film formed on a first interlevel insulation film 11 is made to have a two-layer structure including a second interlevel insulation film 16A having a relatively high mechanical strength (relative permittivity) such as, for example, silicon oxide, and a third interlevel insulation film 18 having a lower mechanical strength (relative permittivity) than that of the second interlevel insulation film 16A, such as, for example, a carbon containing silicon oxide film having a relative permittivity k of about 1.8 to 2.2 and cylindrical gaps (second nano column holes 18a) each having a diameter of a nanometer dimension are formed in the third interlevel insulation film 18.

In this embodiment, contact holes 16a are formed in the second interlevel insulation film 16A, and upper layer interconnects 19 are formed in the third interlevel insulation film 18. The second nano column holes 18a provided in the third interlevel insulation film 18 are formed so that respective bottoms thereof are in touch with the second interlevel insulation film 16A.

The nano column holes 11b and 18a each having a diameter of a nanometer dimension can be formed in an insulation film having a small mechanical strength in an easier manner. Therefore, an interlevel insulation film is formed so as to have a stacked layer structure including an insulation film having a relatively small mechanical strength and an insulation film having a relatively high mechanical strength, so that a selectivity when nano column holes are formed is large and variation in height dimension of nano column holes are improved. Specifically, in the second embodiment, the second nano column holes 18a can be formed so as to pass through the third interlevel insulation film 18 having a relatively small mechanical strength and have bottoms reaching an upper surface of the second interlevel insulation film having a relatively high mechanical strength. In other words, respective bottoms of the second nano column holes 11a all reach the upper surface of the second interlevel insulation film 16A having a relatively high mechanical strength. As a result, it is possible to form highly reliable nano column air gaps having an increased level of freedom and reduced variation while paying considerations about a balance between a high mechanical strength and a low relative permittivity.

In FIG. 4, the height of an interface between the third interlevel insulation film 18 having a relatively low mechanical strength and the second interlevel insulation film 16A having a relatively high mechanical strength coincides with the height of a lower surface of the upper layer interconnects 19. However, the inventive structure is not limited thereto. Specifically, the height of the interlevel may be located lower than the lower surface of the upper layer interconnects 19.

Thus, compared to the structure of FIG. 4, the permittivity between interconnects can be further reduced.

Moreover, an interlevel insulation film having a small mechanical strength (relative permittivity) may be further formed between the second insulation film 16A and the third interlevel insulation film 18.

As has been described, according to the second embodiment, the second nano column holes 18a each have bottoms reaching the upper surface of the second interlevel insulation film 16 having a relatively high mechanical strength. Accordingly, compared to the structure in which respective bottoms of the second nano column holes 18a reach only the middle of the third interlevel insulation film 18 in which the upper layer interconnects 19 are formed, a capacity between upper layer interconnects 19 can be further reduced.

Third Embodiment

Hereafter, a third embodiment of the present invention will be described with reference to the accompanying drawings.

Figure 5:
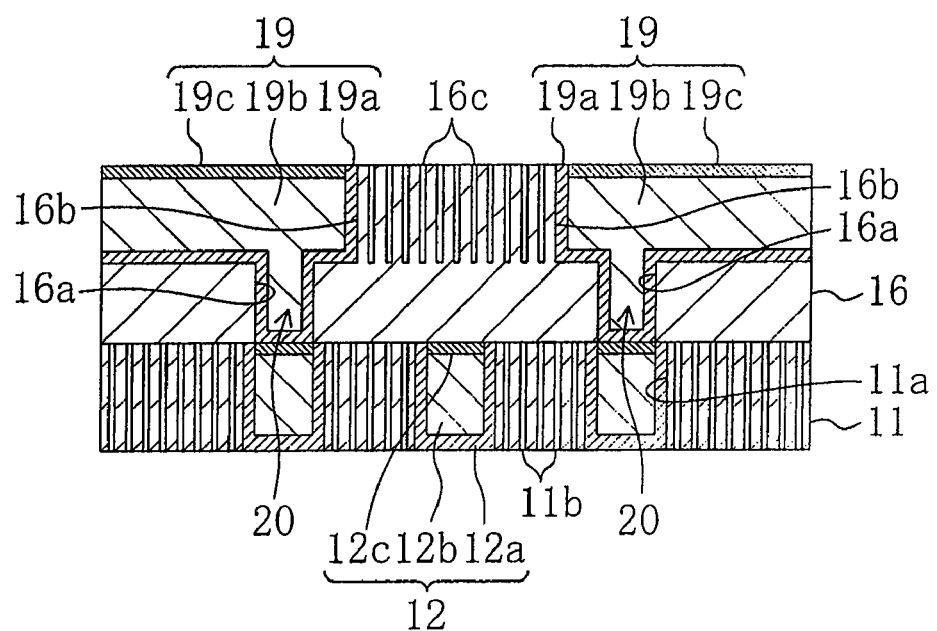
FIG. 5 is a cross-sectional view illustrating major part of a semiconductor device according to a third embodiment of the present invention.
Figure 6A:
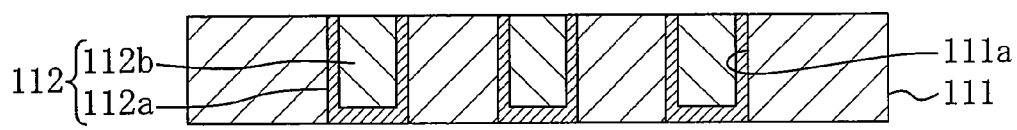
FIGS. 6A and 6B are cross-sectional views illustrating respective steps for fabricating a semiconductor device according to a second known example in order.
Figure 6B:
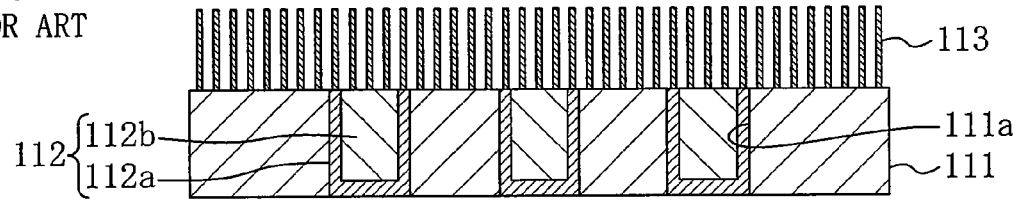
Figure 7:
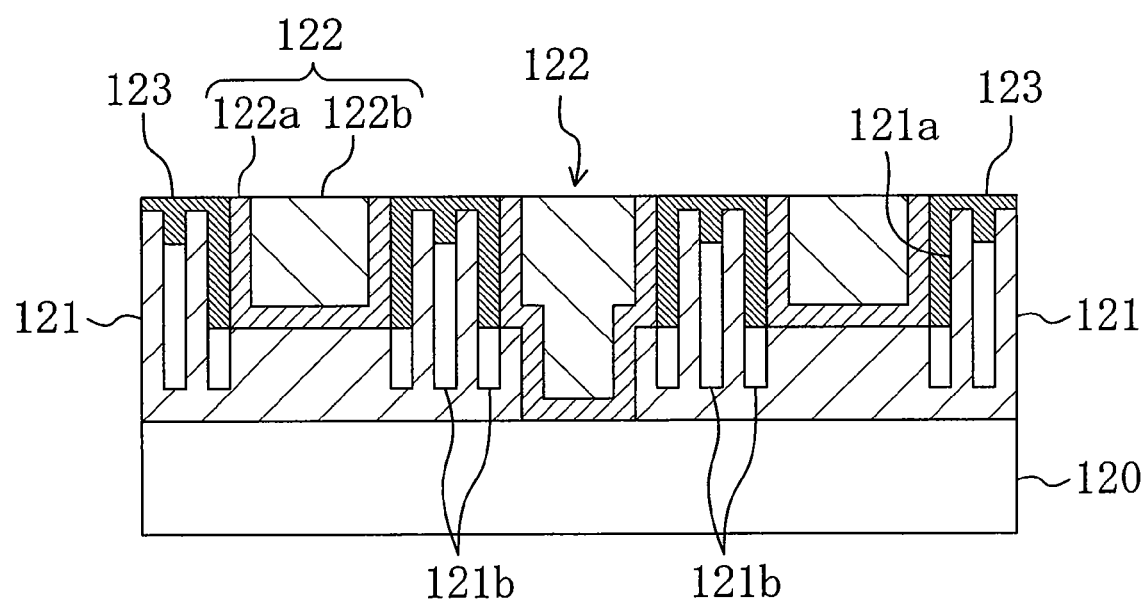
FIG. 7 is a cross-sectional view illustrating major part of a semiconductor device according to a third known example.

FIG. 5 is a cross-sectional view illustrating a cross section of major part of a semiconductor device according to the third embodiment of the present invention. In FIG. 5, each member also shown in FIG. 1 is identified by the same reference numeral and therefore the description thereof will be omitted.

FIG. 5 is a cross-sectional view illustrating a cross section of major part of a semiconductor device according to the third embodiment of the present invention. As shown in FIG. 5, the semiconductor device of the third embodiment is characterized in that a cap film 12c having the function of preventing a copper diffusion is provided in upper part of each of lower layer interconnects 12 and a second interlevel insulation film 16 is directly in contact with the first interlevel insulation film 11 and the lower layer interconnects 12.

Specifically, an insulation barrier film 15 for preventing copper diffusion is not provided, so that the effective permittivity of each of the first interlevel insulation film 11 and the second interlevel insulation film 16 can be largely reduced. Note that it is obvious that the function of preventing copper diffusion is sufficiently served by the first cap film 12c, instead of the insulation barrier film 15.

As has been described, according to the third embodiment, the step of forming the insulation barrier film 15 for preventing copper diffusion is eliminated, so that fabrication process can be simplified and also fabrication costs can be reduced.

Note that in the first through third embodiments, metal of Co, Mn, W, Ta or Ru, an alloy containing at least one metal selected from the group consisting of Co, Mn, W, Ta and Ru, metal oxide of Co, Mn, W, Ta or Ru, or CuSiN can be used for the first cap film 12c and the second cap film 19c which have the function of preventing copper diffusion.

In the first through third embodiments, copper is used as a material for the lower layer interconnects 12 and the upper layer interconnects 19. However, an interconnect material is not particularly limited but, for example, copper, silver, aluminum, or an alloy of at least one selected from the group consisting of copper, silver and aluminum may be used.

As has been described, a semiconductor device according to the present invention and a method for fabricating the semiconductor device allows prevention of increase in effective permittivity between adjacent ones of interconnects and in variation of interconnect width, and also allows reliable formation of nano holes (gaps). The present invention is particularly useful for a semiconductor device including metal interconnects exhibiting high performance and reliability formed by damascene.

What is claimed is:

1. A semiconductor device comprising:
a first insulation film formed over a semiconductor substrate; and
a plurality of first interconnects formed in the first insulation film,
wherein a plurality of gaps are formed in part of the first insulation film located between adjacent ones of the first interconnects so that each of the gaps has a cylindrical shape extending vertically to a principal surface of the semiconductor substrate,
the plurality of gaps are formed so that lower parts of the plurality of gaps and a bottom part of at least one of the plurality of first interconnects are substantially at the same level, and
a cap film is formed of metal or a material containing metal in upper part of each of the first interconnects.

2. The semiconductor device of claim 1, wherein the plurality of gaps are formed as an array pattern in the first insulation film.

3. The semiconductor device of claim 1, wherein a bottom of each of the gaps has a diameter of 2 nm or more and 50 nm or less.

4. The semiconductor device of claim 1, further comprising:
a second insulation film formed under the first insulation film so as to be in contact with respective bottoms of the gaps.

5. The semiconductor device of claim 4, wherein the first insulation film has a smaller permittivity than a permittivity of the second insulation film.

6. The semiconductor device of claim 1, wherein the gaps pass through the first insulation film.

7. The semiconductor device of claim 1, further comprising:
a second insulation film formed on the first insulation film so as to be in contact with the first interconnects; and
second interconnects formed in the second insulation film.

8. The semiconductor device of claim 1, wherein the cap film is formed of metal of Co, Mn, W, Ta or Ru, an alloy containing at least one metal selected from the group consisting of Co, Mn, W, Ta and Ru, metal oxide of Co, Mn, W, Ta or Ru, or CuSiN, and the cap film is conductive.

9. The semiconductor device of claim 1, wherein a lower surface of the first insulation film is substantially flush with a bottom surface of at least one of the plurality of the first interconnects.

10. The semiconductor device of claim 1, further comprising:
a second insulation film formed on the first insulation film; and
at least one plug formed in the second insulation film,
wherein the at least one plug is electrically connected to an associated one of the first interconnects with the cap film interposed therebetween.

11. The semiconductor device of claim 1, wherein the plurality of the first interconnects are made of copper, and the cap film is made of a copper-containing metal.

12. The semiconductor device of claim 1, wherein the cap film is made of CuSiN.

13. The semiconductor device of claim 1, wherein an upper surface of the cap film is substantially flush with an upper surface of the first insulation film.

* * * * *